US007952957B2

(12) United States Patent
Kang

(10) Patent No.: US 7,952,957 B2
(45) Date of Patent: May 31, 2011

(54) CIRCUIT FOR GENERATING READ AND SIGNAL AND CIRCUIT FOR GENERATING INTERNAL CLOCK USING THE SAME

(75) Inventor: Tae Jin Kang, Suwon-si (KR)

(73) Assignee: Hynix Semiconductor Inc., Icheon-si (KR)

(*) Notice: Subject to any disclaimer, the term of this patent is extended or adjusted under 35 U.S.C. 154(b) by 164 days.

(21) Appl. No.: 12/455,594

(22) Filed: Jun. 4, 2009

(65) Prior Publication Data

US 2010/0157719 A1     Jun. 24, 2010

(30) Foreign Application Priority Data

Dec. 23, 2008  (KR) .................. 10-2008-0132033

(51) Int. Cl.
 G11C 7/10  (2006.01)
 G11C 11/4193  (2006.01)
 G11C 8/16  (2006.01)
(52) U.S. Cl. ............. 365/233.1; 365/233.13; 365/193; 365/195; 365/233.5; 365/233.11; 365/227
(58) Field of Classification Search .......... 365/193, 365/195, 233.1, 233.11, 233.13, 233.5, 227
See application file for complete search history.

(56) References Cited

U.S. PATENT DOCUMENTS

| 6,958,953 | B2 | 10/2005 | Retter et al. | |
|---|---|---|---|---|
| 2006/0104126 | A1* | 5/2006 | Park | 365/189.05 |
| 2007/0210850 | A1 | 9/2007 | Lee | |
| 2009/0316503 | A1* | 12/2009 | Ku | 365/194 |

FOREIGN PATENT DOCUMENTS

| JP | 11-016360 | 1/1999 |
|---|---|---|
| KR | 10-2001-0048881 | 6/2001 |

* cited by examiner

*Primary Examiner* — Huan Hoang
*Assistant Examiner* — Jay Radke
(74) *Attorney, Agent, or Firm* — John P. White; Cooper & Dunham LLP

(57) ABSTRACT

A circuit for generating a read end signal includes a clock transferring unit which receives a clock signal, a write/read status signal and an all bank precharge signal and outputs a delayed clock signal, a read signal detecting unit which receives a read pulse signal and the delayed clock signal and generates a read detection signal having a pulse width corresponding to a certain clock, and a read end signal generating unit which receives a first signal, the delayed clock signal and the read detection signal and generates a read end signal.

34 Claims, 6 Drawing Sheets

CIRCUIT FOR GENERATING READ AND SIGNAL AND CIRCUIT FOR GENERATING INTERNAL CLOCK USING THE SAME

TECHNICAL FIELD

This disclosure relates to a circuit for generating an internal clock, and more particularly, to a circuit for generating a read end signal capable of reducing current consumption.

BACKGROUND

In recent times, a main issue in the field of semiconductor memories has changed from an integration degree to an operation speed. Therefore, a high speed synchronous memory such as a Double Data Rate Synchronous Dynamic RAM (DDR SDRAM) and a RAMBUS DRAM is a general trend in the field of the semiconductor memories Synchronous memory refers to a memory which operates in synchronization with an external clock, and includes, for example, SDRAM, which is in a main stream of a commercial memory market in DRAMs. Input/output operation of the SDRAM is synchronized with a rising edge of an external clock and data access is performed once every clock period. However, data input/output operation of a DDR SDRAM is synchronized with not only the rising edge but also a falling edge of the external clock and data access is performed twice every clock period. That is to say, the DDR SDRAM has a data input/output speed which is two times as fast as that of the conventional SDRAM. Therefore, a high speed semiconductor memory device like the DDR SDRAM generates a clock which is enabled at a rising edge time of an external clock (hereinafter, referred to as a rising clock rclk) and a clock which is enabled at a falling edge time of the external clock (hereinafter, referred to as a falling clock fclk) in order to output data upon read operation.

FIG. 1 is a block diagram showing the structure of a conventional circuit for generating an internal circuit.

As shown in FIG. 1, the internal clock generating circuit to includes an enabling signal generating unit 1 which receives a read pulse signal RDP, a write/read status signal WTRD and an all bank precharge flag signal BANKALL and generates a clock enabling signal clkenb, and a clock generating unit 2 which generates rising and falling clock signals rclk, fclk in response to the clock enabling signal clkenb.

The enabling signal generating unit 1 generates a clock enabling signal clkenb at a low level by the read pulse signal which is applied as a pulse upon the read operation, and the clock generating unit 2 receiving the clock enabling signal clkenb at a low level generates the rising and falling clock signals rclk, fclk. The rising and falling clock signals rclk, fclk are used to output data to a DQ pad (not shown) upon the read operation and are used only in the read operation.

However, the conventional internal clock generating clock stops generation of the rising and falling clock signals rclk, fclk when a write operation begins or a semiconductor device memory is in an all bank precharge state in which the banks of the semiconductor memory device are all precharged. That is to say, the enabling signal generating unit generates a clock enabling signal clkenb at a high level by the write/read status signal WTRD which is shifted to a low level upon write operation and the all bank precharge flag signal BANKALL which is shifted to a high level in an all bank precharge state, and the clock generating unit 2 stops the generation of the rising and falling clock signals rclk, fclk.

Accordingly, the conventional internal clock generating circuit continuously generates the rising and falling clock signals rclk, fclk when the write operation does not begin or the semiconductor memory device is not in the all bank precharge state though the read operation is ended, and this causes an increase in current consumption.

BRIEF SUMMARY

In an aspect of this disclosure, there is provided a circuit that generates a read end signal enabled when read operation is completed, to stop generation of rising and falling clock signals, thereby capable of reducing current consumption, and a circuit for generating an internal clock using the same.

In an embodiment of this disclosure, a circuit for generating a read end signal includes a clock transferring unit which receives a clock signal, a write/read status signal and an all bank precharge signal and outputs a delayed clock signal, a read signal detecting unit which receives a read pulse signal and the delayed clock signal and generates a read detection signal having a pulse width corresponding to a certain clock, and a read end signal generating unit which receives a first signal, the delayed clock signal and the read detection signal and generates a read end signal.

In another embodiment, a circuit for generating an internal clock includes a read end signal generating circuit which receives a read pulse signal and a first signal maintained at a high level for a certain period when the read pulse signal is inputted and generates a read end signal, a clock controlling unit which receives the read pulse signal and the read end signal and generates a clock enabling signal, wherein the clock controlling unit disables to output the clock enabling signal when the read end signal is enabled, and a clock generating unit which receives the clock signal and the clock enabling signal and generates rising and falling clock signals.

In another embodiment, a circuit for generating an internal clock includes a read signal detecting unit which receives a read pulse signal and a delayed clock signal and generates a read detection signal having a pulse width corresponding to a certain clock, a read end signal generating unit which receives a first signal, the delayed clock signal and the read detection signal and generates a read end signal, a clock controlling unit which receives the read pulse signal and the read end signal and generates a clock enabling signal, wherein the clock controlling unit disables to output the clock enabling signal when the read end signal is enabled, and a clock generating unit which receives the clock signal and the clock enabling signal and generates rising and falling clock signals.

BRIEF DESCRIPTION OF THE DRAWINGS

The above and other aspects, features and other advantages will be more clearly understood from the following detailed description taken in conjunction with the accompanying drawings, in which.

DETAILED DESCRIPTION OF PREFERRED EMBODIMENTS

Hereinafter, embodiment of the present invention will be described with reference to accompanying drawings. However, the embodiments are for illustrative purposes only and are not intend to limit the scope of the invention.

Figure 1:
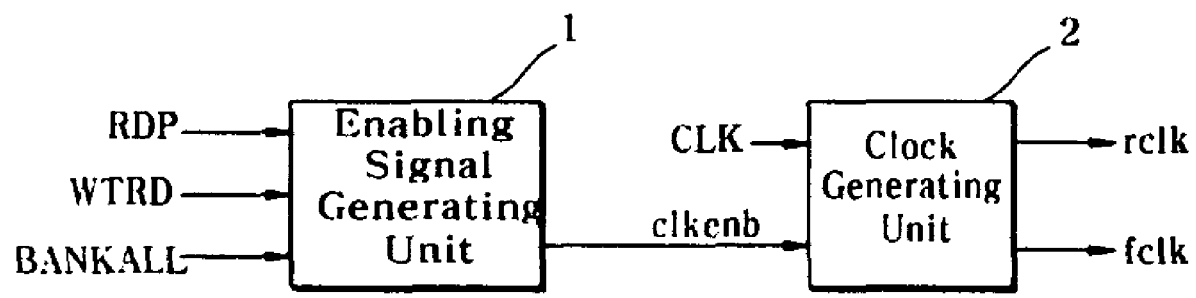
FIG. 1 is a block diagram showing the structure of a conventional circuit for generating an internal clock.
Figure 2:
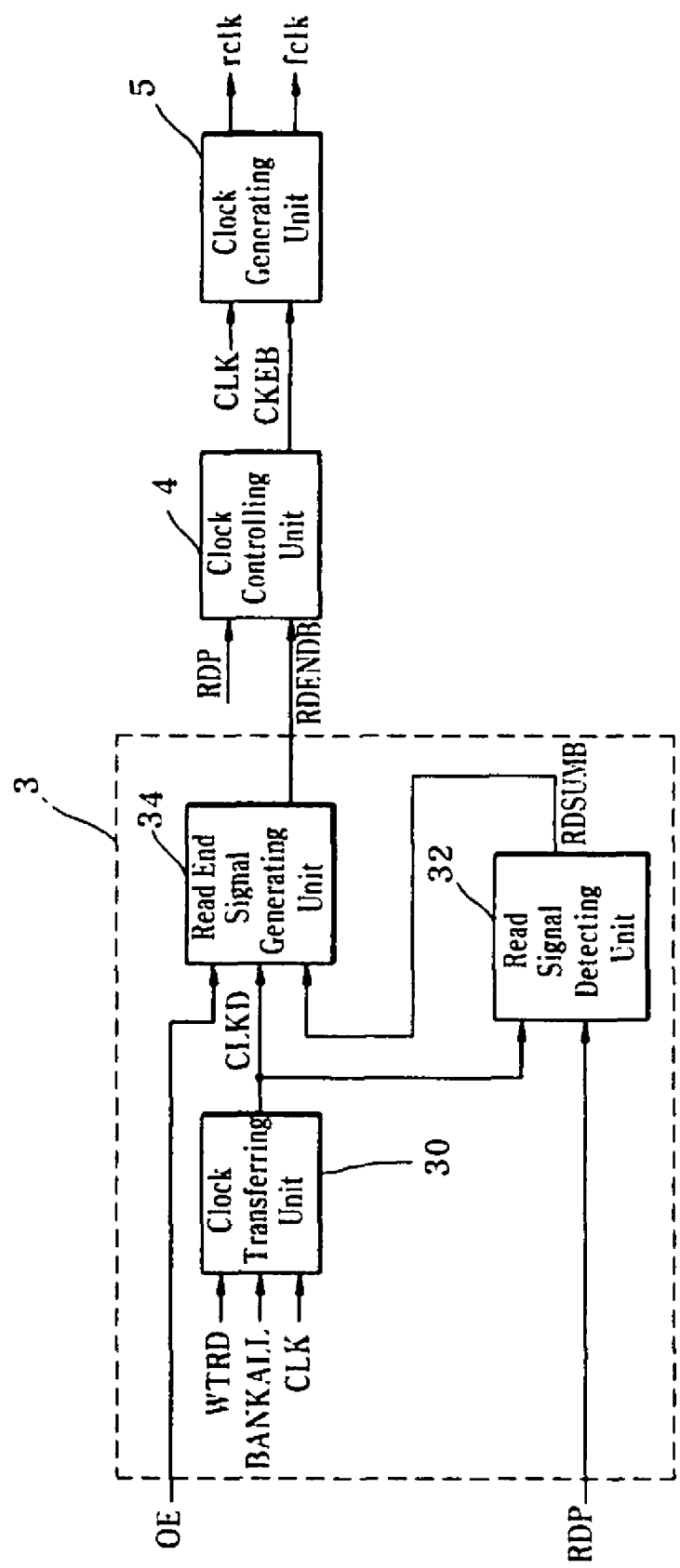
FIG. 2 is a block diagram showing the structure of a circuit for generating an internal clock in accordance with an embodiment of this disclosure.

FIG. 2 is a block diagram showing the structure of a circuit for generating an internal clock in accordance with an embodiment of this disclosure.

As shown in FIG. 2, the internal clock generating circuit includes a read end signal generating circuit 3, a clock controlling unit 4 and a clock generating unit 5.

The read end signal generating circuit 3 includes a clock transferring unit 30, a read signal detecting unit 32 and a read end signal generating unit 34.

Figure 3:
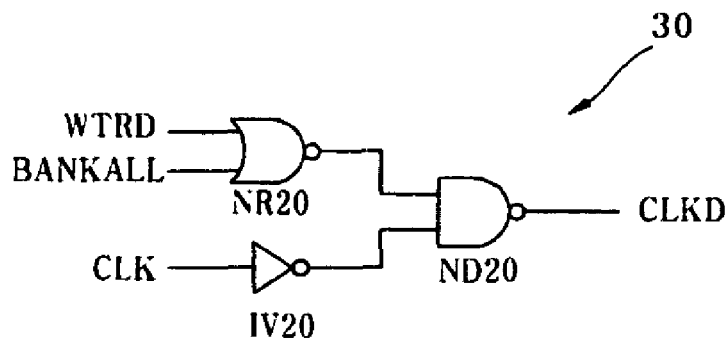
FIG. 3 is a circuit diagram showing a clock transferring unit included in the internal clock generating circuit of FIG. 2.

Referring to FIG. 3, the clock transferring unit 30 includes a NOR gate NR20 which receives a write/read status signal WTRD and an all bank precharge flag signal BANKALL and performs a logical NOR operation, and a NAND gate ND20 which receives the output signal from the NOR gate NR20 and a clock signal inverted by an inverter IV20 and performs a logical NAND operation to output a delayed clock signal CLKD.

The clock transferring unit 30 generates the delayed clock signal CLKD based on the clock signal CLK in combination with the write/read status signal WTRD and the all bank precharge flag signal BANKALL, both generated at low levels upon read operation.

Figure 4:
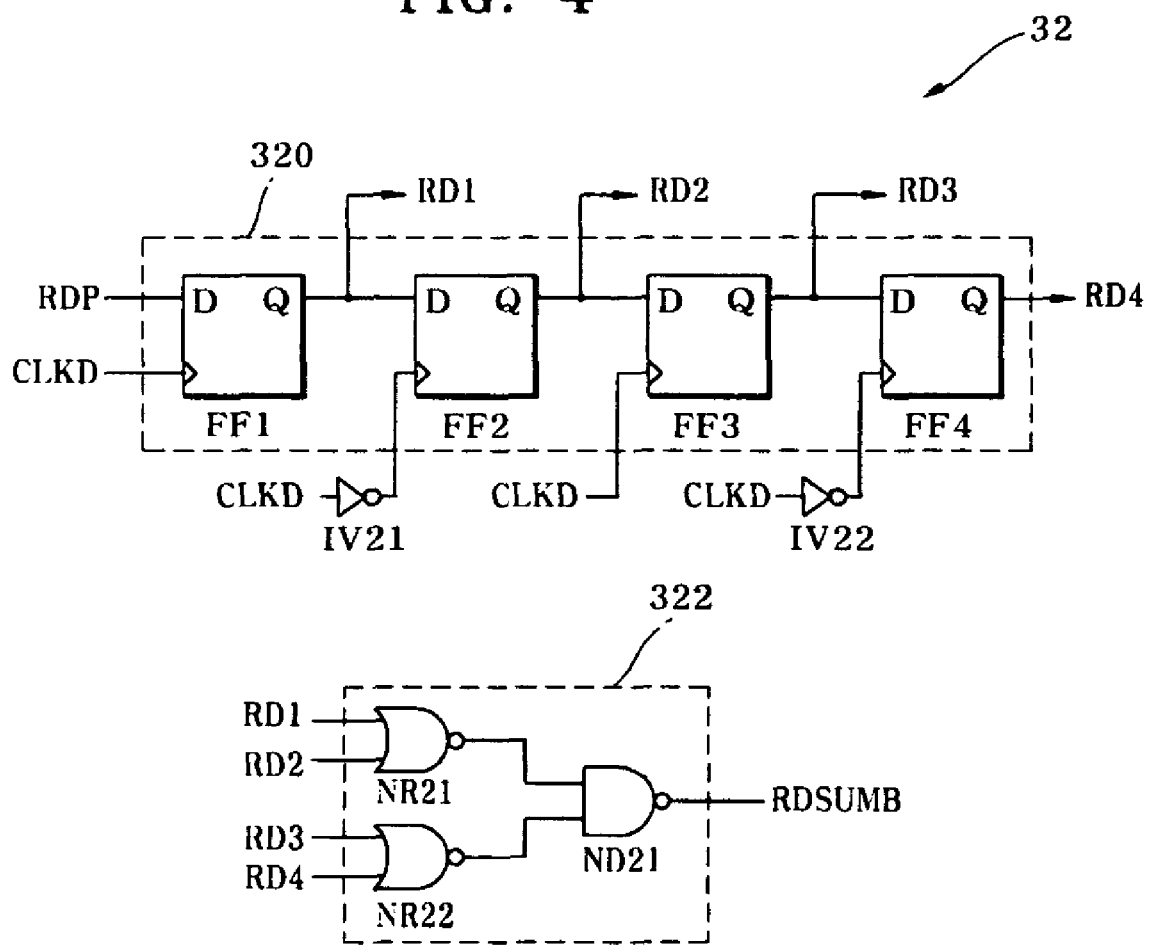
FIG. 4 is a circuit diagram showing a read signal detecting unit included in the internal clock generating circuit of FIG. 2.

Referring to FIG. 4, the read signal detecting unit 32 includes a read detection signal controlling unit 320 and a read detection signal outputting unit 322. The read detection signal controlling unit 320 includes a first flip-flop FF1 which synchronizes a read pulse signal RDP with a falling edge of the delayed clock signal CLKD to output a first read signal RD1 having a pulse width of one clock period, a second flip-flop FF2 which synchronizes the first read signal RD1 with the rising edge of the delayed clock signal CLKD and shifts the first read signal RD1 by half clock period to output a second read signal RD2 having a pulse width of one clock period, a third flip-flop FF3 which synchronizes the second read signal RD2 with the falling edge of the delayed clock signal CLKD and shifts the second read signal RD2 by half lock period to output a third read signal RD3 having a pulse width of one clock period, and a fourth flip-flop FF4 which synchronizes the third read signal RD3 with the rising edge of the delayed clock signal CLKD and shifts the third read signal RD3 by half lock period to output a fourth read signal RD4 having a pulse width of one clock period.

The read detection signal outputting unit 322 includes a NOR gate NR21 which receives the first and second read signals RD1, RD2 and performs a logical NOR operation, a NOR gate NR22 which receives the third and fourth read signals RD3, RD4 and performs a logical NOR operation, and a NAND gate ND21 which receives the output signals from the NOR gates NR21, NR22 and performs a logical NAND operation to output a read detection signal RDSUMB.

The read signal detecting unit 32 outputs the read detection signal RDSUMB at a low level when the first through fourth detection signals RD1-RD4 generated from the first through fourth flip-flops FF1-FF4 are all at low levels. More specifically, if a pulse of a new read pulse signal RDP is not applied for about 2.5 clock periods after a pulse of a read pulse signal RDP is applied, the first through fourth detection signals RD1-RD4 generated from the first through fourth flip-flops FF1-FF4 are all outputted at low levels. Therefore, the read detection signal RDSUMB is enabled at a low level by the first through fourth detection signals RD1-RD4 at low levels.

Figure 5:
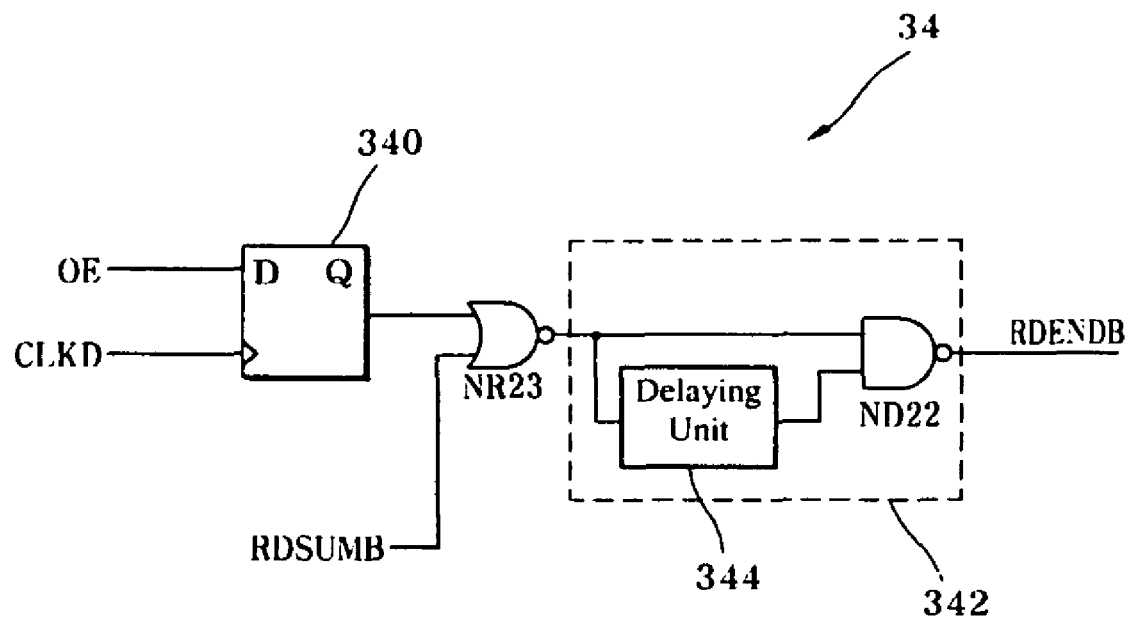
FIG. 5 is a circuit diagram showing a read end signal generating unit included in the internal clock generating circuit of FIG. 2.

Referring to FIG. 5, the read end signal generating unit 34 includes a flip-flop 340 which receives a first signal OE and the delayed clock signal CLKD and shifts the first signal OE by one clock period to output the shifted signal, a NOR gate NR23 which receives the output signal from the flip-flop 340 and the read detection signal RDSUMB and performs a logical NOR operation, and a pulse generating unit 342 which receives the output signal from the NOR gate NR23 and outputs a read end signal RDENDB having a certain pulse width. The first signal OE is a signal outputted from a mode register (not shown), which is disabled at a low level in a normal state and is maintained at a high level for a period of CAS latency (CL) and burst length (BL) and level shifted again to a low level when a pulse of the read pulse signal RDP is inputted.

In general, a Mode Register Definition (MRD) defines the burst length (BL) and the CAS latency (CL). For example, when the CAS latency and the burst length are set to CL=3 and BL=4 in the MDR, four data are outputted for two clock periods after three clocks from the input of the read pulse signal RDP. Therefore, the first signal OE is maintained at a high level for five clock periods when the CAS latency and the burst length are set to CL=3 and BL=4 in the MDR.

The pulse generating unit 342 includes a delaying unit 344 which delays the output signal from the NOR gate NR23 by a certain period and outputs the delayed signal and a NAND gate ND22 which receives the output signal from the delaying unit 344 and the output signal from the NOR gate NR23 and outputs the read end signal RDENDB having a pulse width corresponding to the delaying period of the delaying unit 344. The delaying unit 344 includes an odd number of inverters. The read end signal generating unit 34 generates, when the read detection signal RDSUMB and the first signal OE are shifted to low levels, the read end signal RDENDB which is enabled at a low level for the delaying period of the delaying unit 344 from the period where the first signal OE is shifted to a low level. Therefore, the generation of the read end signal RDENDB at a low level means that a new read pulse signal RDP is not inputted for a certain period.

The read end signal generating circuit 3 enables output of the read end signal RDENDB at a low level when read operation by the read pulse signal RDP is ended and a new read pulse signal RDP is not applied.

Figure 6:
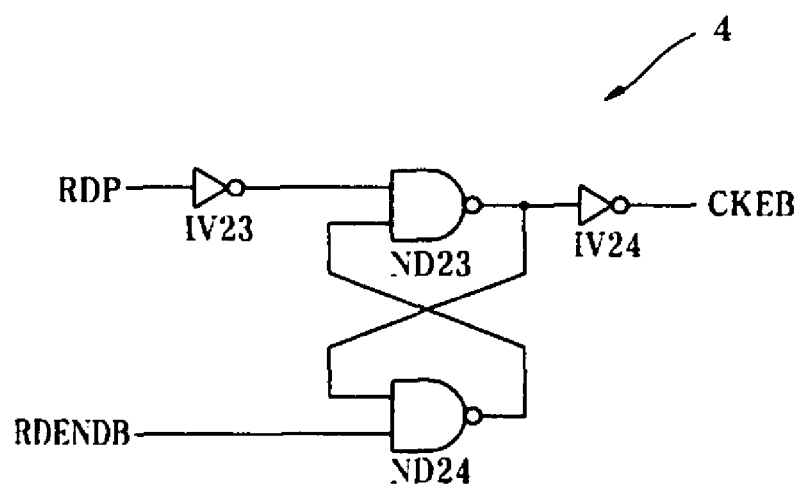
FIG. 6 is a circuit diagram showing a clock control unit detecting unit included in the internal clock generating circuit of FIG. 2.

Referring to FIG. 6, the clock controlling unit 4 includes NAND gate latches ND23, ND24 which enable output of a clock enabling signal CKEB when the pulse of the read pulse signal RDP is inputted, and disable output of the clock enabling signal CKEB when the read end signal RDENDB is enabled.

The clock controlling unit 4 enables output of the clock enabling signal CKEB and maintains the signal at a low level through the NAND gate latches ND23, ND 24 when the read pulse signal RDP is inputted at a high pulse. After that, the clock controlling unit 4 disables output of the clock enabling signal CKEB at a high level when the read pulse signal RDP is inputted at a low pulse.

Figure 7:
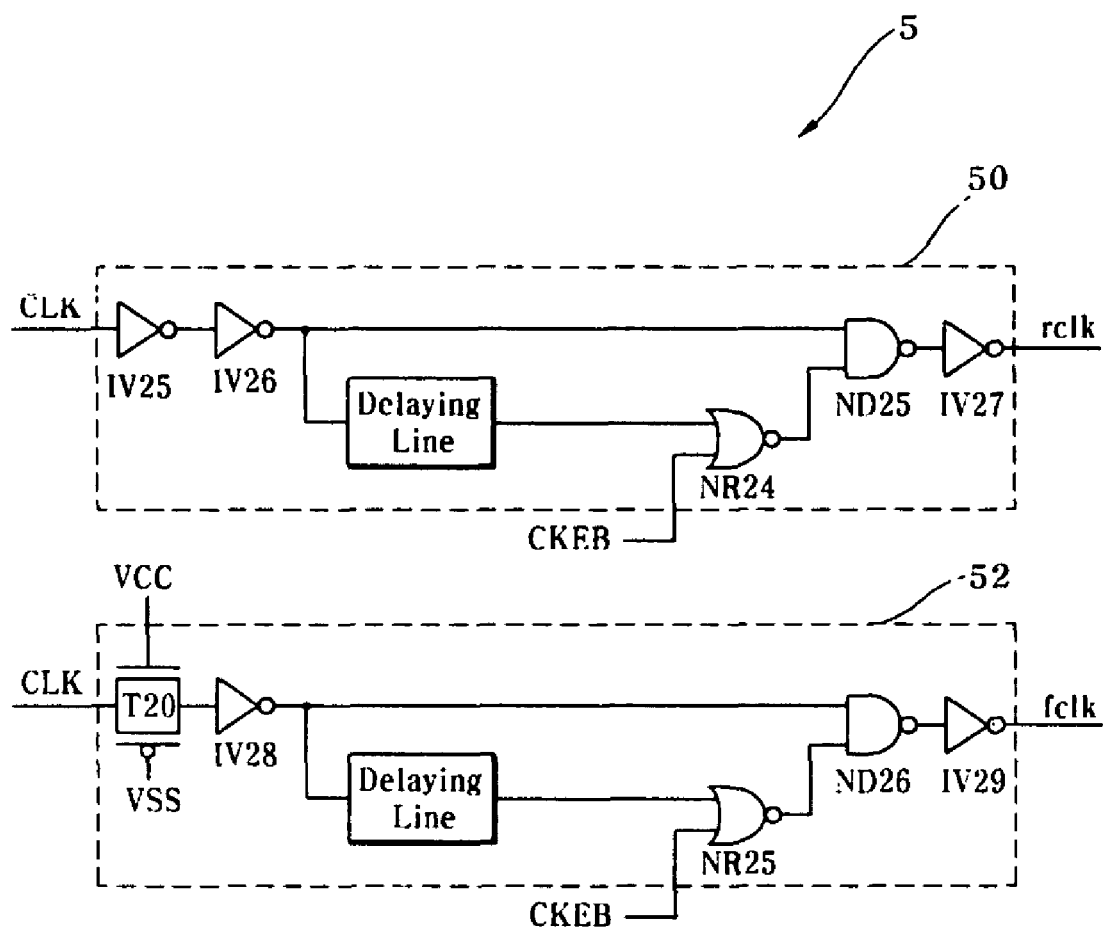
FIG. 7 is a circuit diagram showing a clock generating unit included in the internal clock generating circuit of FIG. 2.
Figure 8:
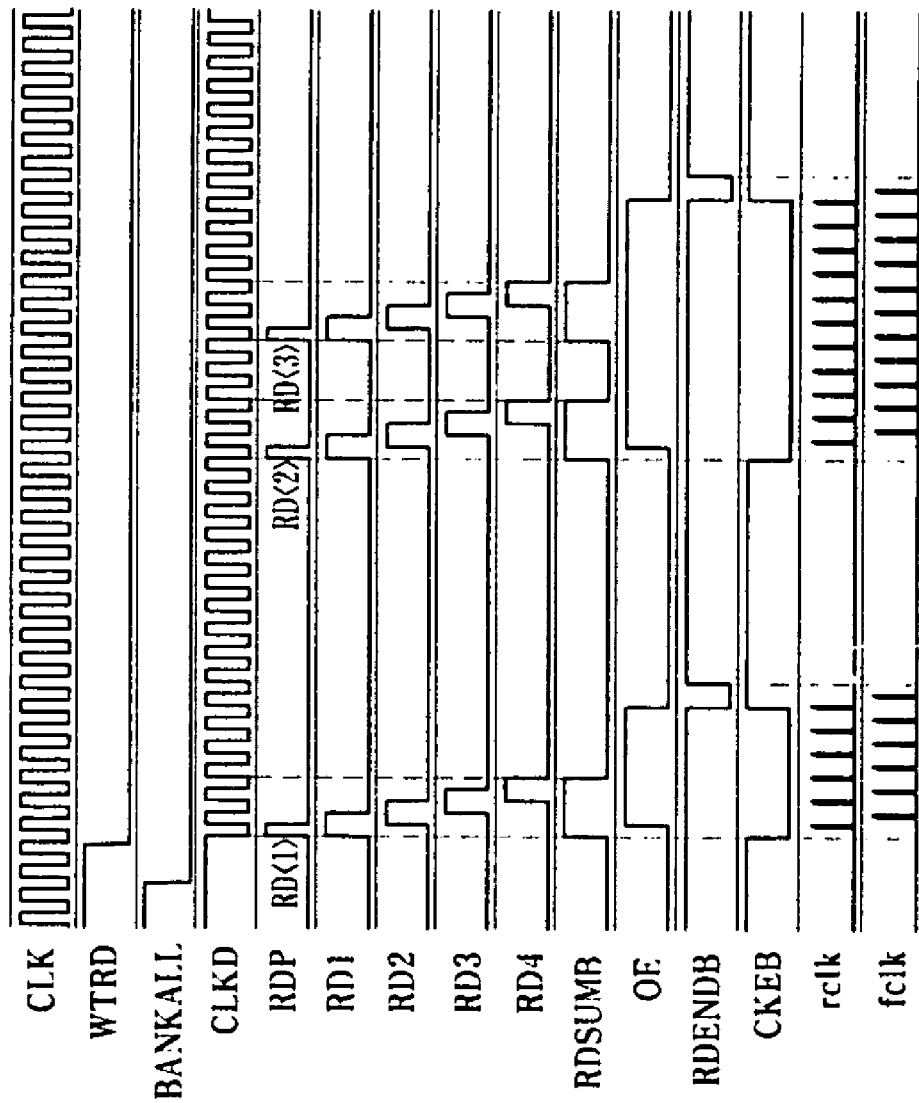
FIG. 8 is a waveform showing the operation of the internal clock generating circuit of FIG. 2.

Referring to FIG. 7, the clock generating unit 5 includes a rising clock generating unit 50 which receives the clock enabling signal CKEB and the clock signal CLK and generates a rising clock signal rclk, and a falling clock generating unit 52 which receives the clock enabling signal CKEB and the clock signal CLK and generates a falling clock signal fclk.

The clock generating unit 5 receives the clock signal CLK when the clock enabling signal CKEB is enabled at a low level and generates the rising and falling clock signals rclk, fclk having a certain pulse width.

Hereinafter, operation of the internal clock generating circuit as described above will be described in more detail with reference to FIGS. 2 to 8.

Operation of the internal clock generating circuit in a case that a pulse of the read pulse signal RDP is applied according to a first read command RD<1> will be described.

When a pulse of the read pulse signal RDP is applied, the clock controlling unit 4 shown in FIG. 6 enables output of the clock enabling signal CKEB at a low level. If the clock enabling signal CKEB is enabled at a low level, the clock generating unit 5 shown in FIG. 7 receives the clock signal CLK and generates the rising and falling clock signals rclk, fclk having a certain pulse width. Also, the clock transferring unit 30 shown in FIG. 3 generates the delayed clock signal CLKD based on the clock signal CLK in combination with the write/read status signal WTRD and the all bank precharge flag signal BANKALL, both generated at low levels upon read operation.

Next, the read signal detecting unit 32 receives the read pulse signal RDP and the delayed clock signal CLKD and generates the read detection signal RDSUMB. Specifically, if a pulse of a new read pulse signal RDP is not applied for 2.5 clock periods after a pulse of a read pulse signal RDP is applied, the first through fourth detection signals RD1-RD4 generated from the first through fourth flip-flops FF1-FF4 are all outputted at low levels. Therefore, the read pulse signal RDP is enabled at a low level after lapse of 2.5 periods by the first through fourth detection signals RD1-RD4 at low levels. At this time, the first signal OE is maintained at a high level for 5 clock periods by the MRD in which the CAS latency and the burst length are set to CL=3 and BL=4.

Next, the read end signal generating unit 34 shown in FIG. 5 receives the first signal OE and the delayed clock signal CLKD and generates the read end signal RDENDB in response to the read detection signal RDSUMB. More specifically, when the read detection signal RDSUMB and the first signal OR are shifted to low levels, the read end signal RDENDB is enabled at a low level for the delaying period of the delaying unit 344. That is to say, the read end signal RDENDB is enabled at a low level for the delaying period of the delaying unit 344 from the period where the first signal OE is shifted to a low level. Therefore, the generation of the read end signal RDENDB at a low level means that a new read pulse signal RDP is not inputted for a certain period.

Next, the clock controlling unit 4 shown in FIG. 6 receives the read end signal RDENDB at a low level and disables output of the clock enabling signal CKEB at a high level. Therefore, the clock generating unit 5 shown in FIG. 7 stops the generation of the rising and falling clock signals rclk, fclk when the clock enabling signal CKEB is disabled at a high level.

As described above, the internal clock generating circuit in accordance with an embodiment of the present invention generates the read end signal RDENDB enabled at a low level to stop generation of the rising and falling clock signals rclk, fclk in the clock generating unit 5, thereby capable of reducing current consumption.

Hereinafter, operation of the internal clock generating circuit in a case that a pulse of the read pulse signal RDP is applied according to second and third read commands RD<2>, RD<3> which are continuously inputted will be described.

First, when a pulse of the read pulse signal RDP is applied according to the continuously inputted second and third read commands RD<2>, RD<3> are applied, the clock controlling unit 4 shown in FIG. 6 enables output of the clock enabling signal CKEB at a low level. If the clock enabling signal CKEB is enabled at a low level, the clock generating unit 5 shown in FIG. 7 receives the clock signal CLK and generates the rising and falling clock signals rclk, fclk having a certain pulse width. Also, the clock transferring unit 30 shown in FIG. 3 generates the delayed clock signal CLKD based on the clock signal CLK in combination with the write/read status signal WTRD and the all bank precharge flag signal BANKALL, both generated at low levels upon read operation.

Next, the read signal detecting unit 32 receives the read pulse signal RDP and the delayed clock signal CLKD and generates the read detection signal RDSUMB. Specifically, if a pulse of a new read pulse signal RDP is not applied for 2.5 clock periods after a pulse of a read pulse signal RDP is applied according to the second read command RD<2>, the first through fourth detection signals RD1-RD4 generated from the first through fourth flip-flops FF1-FF4 are all outputted at low levels. Therefore, the read pulse signal RDP is enabled at a low level after lapse of 2.5 periods after the second read command RD<2> is inputted by the first through fourth detection signals RD1-RD4 at low levels.

Also, if a pulse of a new read pulse signal RDP is not applied for 2.5 clock periods after a pulse of a read pulse signal RDP is applied according to the third read command RD<3> which is inputted after lapse of 5 clocks from the input of the second read command RD<2>, the first through fourth detection signals RD1-RD4 generated from the first through fourth flip-flops FF1-FF4 are all outputted at low levels. Therefore, the read pulse signal RDP is enabled at a low level after lapse of 2.5 periods after the third read command RD<3> is inputted by the first through fourth detection signals RD1-RD4 at low levels.

Meanwhile, the first signal OE is maintained at a high level for five clock periods by the second read command RD<2> and then maintained at a high level for five additional clock periods by the subsequently inputted third read command RD<3>. That is to say, the first signal OE is maintained at a high level for a total of ten clock periods when a pulse of the read pulse signal RDP is applied according to the continuously inputted second and third read commands RD<2>, RD<3>.

Next, the read end signal generating unit 34 shown in FIG. 5 receives the first signal OE and the delayed clock signal CLKD and generates the read end signal RDENDB in response to the read detection signal RDSUMB. More specifically, when the read detection signal RDSUMB and the first signal OR are shifted to low levels, the read end signal RDENDB is enabled at a low level for the delaying period of the delaying unit 344. As described above, since the first signal is maintained at a high level for 10 clock periods according to the continuously inputted second and third commands RD<2>, RD<3> and then shifted to a low level, the generation of the read end signal RDENDB at a low level when the first signal OE is shifted to a low level means that the read operation according to the second and third commands RD<2>, RD<3> are ended and a new read pulse signal RDP is not inputted.

Next, the clock controlling unit 4 shown in FIG. 6 receives the read end signal RDENDB enabled at a low level and disables output of the clock enabling signal CKEB at a high level. Therefore, the clock generating unit 5 shown in FIG. 7 stops the generation of the rising and falling clock signals rclk, fclk when the clock enabling signal CKEB is disabled at a high level.

As described above, the circuit for generating an internal clock in accordance with an embodiment of the present invention generates the read end signal RDENDB enabled at a low level to stop generation of the rising and falling clock signals rclk, fclk when the read operation according to the continuously inputted second and third commands RD<2>, RD<3>. Therefore, the circuit for generating an internal clock in accordance with an embodiment of the present invention stops the operation of the clock generating unit 5 after the read operation is ended, thereby capable of reducing current consumption.

While the present invention has been described with respect to the specific embodiments, it will be apparent to those skilled in the art that various changes and modifications may be made without departing from the spirit and scope of the disclosure and the following claims.

The present application claims priority to Korean application number 10-2008-0132033, filed on Dec. 23, 2008, the entire contents of which are incorporated herein by reference.

What is claimed is:

1. A circuit for generating a read end signal, comprising:
a clock transferring unit which receives a clock signal, a write/read status signal and an all bank precharge signal and outputs a delayed clock signal;
a read signal detecting unit which receives a read pulse signal and the delayed clock signal and generates a read detection signal having a pulse width corresponding to a certain clock; and
a read end signal generating unit which receives a first signal, the delayed clock signal and the read detection signal and generates a read end signal.

2. The circuit of claim 1, wherein the clock transferring unit generates the delayed clock signal from the clock signal when the write/read status signal and the all bank precharge signal are both at low levels upon read operation.

3. The circuit of claim 2, wherein the clock transferring unit includes:
a first logic device which receives the write/read status signal and the all bank precharge signal and performs a logical operation; and
a second logic device which receives an output signal from the first logic device and the clock signal and performs a logical operation to generate the delayed clock signal.

4. The circuit of claim 1, wherein the read signal detecting unit includes:
a read detection signal controlling unit which receives the read pulse signal and the delayed clock signal and shifts the read pulse signal by the certain clock to output first through fourth read signals; and
a read detection signal outputting unit which receives the first through fourth read signals and performs a logical operation to output the read detection signal.

5. The circuit of claim 4, wherein the read detection signal controlling unit includes:
a first flip-flop which synchronizes the read pulse signal with the delayed clock signal to output the first read signal;
a second flip-flop which synchronizes the first read signal with an inverted signal of the delayed clock signal to output the second read signal;
a third flip-flop which synchronizes the second read signal with the delayed clock signal to output the third read signal; and
a fourth flip-flop which synchronizes the third read signal with an inverted signal of the delayed clock signal to output the fourth read signal.

6. The circuit of claim 4, wherein the read detection signal outputting unit includes:
a first logic device which receives the first and second read signals and performs a logical operation;
a second logic device which receives the third and fourth read signals and performs a logical operation; and
a third logic device which receives the output signal from the first logic device and the output signal from the second logic device and performs a logical operation to generate the read detection signal.

7. The circuit of claim 1, wherein the first signal is maintained at a high level for a period of CAS latency and burst length when the read pulse signal is inputted.

8. The circuit of claim 1, wherein the read end signal generating unit enables output of the read end signal at a low pulse when the first signal which has been maintained at a high level is disabled at a low level and a pulse of a second read pulse signal is not inputted until a certain period is elapsed after the pulse of the first read pulse signal is applied.

9. The circuit of claim 1, wherein the read end signal generating unit includes:
a flip-flop which receives the first signal and the delayed clock signal and shifts the first signal by a certain clock period to output a shifted signal;
a logic unit which receives the shifted signal from the flip-flop and the read detection signal and performs a logical operation; and
a pulse generating unit which receives an output signal from the logic unit and generates the read end signal having a certain pulse width.

10. The circuit of claim 9, wherein the pulse generating unit includes:
a delaying unit which delays the output signal from the logic unit by a certain period and outputs a delayed signal; and
a logic device which receives the output signal from the logic unit and the delayed signal from the delaying unit and performs a logical operation to generate the read end signal having a pulse width corresponding to the certain delay period of the delaying unit.

11. An internal clock generating circuit for generating an internal clock, comprising:
a read end signal generating circuit which receives a read pulse signal and a first signal maintained at a high level for a certain period when the read pulse signal is inputted and generates a read end signal;
a clock controlling unit which receives the read pulse signal and the read end signal and generates a clock enabling signal, wherein the clock controlling unit disables output of the clock enabling signal when the read end signal is enabled; and
a clock generating unit which receives a clock signal and the clock enabling signal and generates rising and falling clock signals.

12. The internal clock generating circuit of claim 11, wherein the first signal is maintained at a high level for a period of CAS latency and burst length when the read pulse signal is inputted.

13. The internal clock generating circuit of claim 11, wherein the read end signal generating circuit enables output of the read end signal at a low pulse when the first signal which has been maintained at a high level is disabled at a low level and a pulse of a second read pulse signal is not inputted until a certain period is elapsed after the pulse of the first read pulse signal is applied.

14. The internal clock generating circuit of claim 11, wherein the read end signal generating circuit includes:
   a clock transferring unit which receives the clock signal, a write/read status signal and an all bank precharge signal and outputs a delayed clock signal;
   a read signal detecting unit which receives the read pulse signal and the delayed clock signal and generates a read detection signal having a pulse width corresponding to a certain clock; and
   a read end signal generating unit which receives the first signal, the delayed clock signal and the read detection signal and generates the read end signal.

15. The internal clock generating circuit of claim 14, wherein the clock transferring unit includes:
   a first logic device which receives the write/read status signal and the all bank precharge signal and performs a logical operation; and
   a second logic device which receives an output signal from the first logic device and the clock signal and performs a logical operation to generate the delayed clock signal.

16. The internal clock generating circuit of claim 14, wherein the read signal detecting unit includes:
   a read detection signal controlling unit which receives the read pulse signal and the delayed clock signal and shifts the read pulse signal by a certain clock to output first through fourth read signals; and
   a read detection signal outputting unit which receives the first through fourth read signals and performs a logical operation to output the read detection signal.

17. The internal clock generating circuit of claim 16, wherein the read detection signal controlling unit includes:
   a first flip-flop which synchronizes the read pulse signal with the delayed clock signal to output the first read signal;
   a second flip-flop which synchronizes the first read signal with an inverted signal of the delayed clock signal to output the second read signal;
   a third flip-flop which synchronizes the second read signal with the delayed clock signal to output the third read signal; and
   a fourth flip-flop which synchronizes the third read signal with an inverted signal of the delayed clock signal to output the fourth read signal.

18. The internal clock generating circuit of claim 16, wherein the read detection signal outputting unit includes:
   a first logic device which receives the first and second read signals and performs a logical operation;
   a second logic device which receives the third and fourth read signals and performs a logical operation; and
   a third logic device which receives a first output signal from the first logic device and a second output signal from the second logic device and performs a logical operation to generate the read detection signal.

19. The internal clock generating circuit of claim 14, wherein the read end signal generating unit includes:
   a flip-flop which receives the first signal and the delayed clock signal and shifts the first signal by a certain clock period to output a shifted signal;
   a logic unit which receives the shifted signal from the flip-flop and the read detection signal and performs a logical operation; and
   a pulse generating unit which receives an output signal from the logic unit and generates the read end signal having a certain pulse width.

20. The internal clock generating circuit of claim 19, wherein the pulse generating unit includes:
   a delaying unit which delays the output signal from the logic unit by the certain period and outputs a delayed signal; and
   a logic device which receives the output signal from the logic unit and the delayed signal from the delaying unit and performs a logical operation to generate the read end signal having a pulse width corresponding to the certain delay period of the delaying unit.

21. The internal clock generating circuit of claim 11, wherein the clock controlling unit includes a latching unit which enables output of the clock enabling signal when the read pulse signal is inputted and disables output of the clock enabling signal when the read end signal is enabled.

22. The internal clock generating circuit of claim 11, wherein the clock generating unit includes:
   a rising clock generating unit which receives the clock signal and the clock enabling signal and generates the rising clock signal; and
   a falling clock generating unit which receives the clock signal and the clock enabling signal and generates the falling clock signal.

23. An internal clock generating circuit for generating an internal clock, comprising:
   a read signal detecting unit which receives a read pulse signal and a delayed clock signal and generates a read detection signal having a pulse width corresponding to a certain clock;
   a read end signal generating unit which receives a first signal, the delayed clock signal and the read detection signal and generates a read end signal;
   a clock controlling unit which receives the read pulse signal and the read end signal and generates a clock enabling signal, wherein the clock controlling unit disables output of the clock enabling signal when the read end signal is enabled; and
   a clock generating unit which receives the clock signal and the clock enabling signal and generates rising and falling clock signals.

24. The internal clock generating circuit of claim 23, wherein the first signal is maintained at a high level for a period of CAS latency and burst length when the read pulse signal is inputted.

25. The internal clock generating circuit of claim 23, wherein the read end signal generating unit enables output of the read end signal when the first signal which has been maintained at a high level is disabled and the read pulse signal is not inputted until a certain period is elapsed.

26. The internal clock generating circuit of claim 23, further comprising: a clock transferring unit which receives the clock signal, a write/read status signal and an all bank precharge flag signal and outputs the delayed clock signal.

27. The internal clock generating circuit of claim 26, wherein the clock transferring unit includes:
   a first logic device which receives the write/read status signal and the all bank precharge signal and performs a logical operation; and
   a second logic device which receives an output signal from the first logic device and the clock signal and performs a logical operation to generate the delayed clock signal.

28. The internal clock generating circuit of claim 23, wherein the read signal detecting unit includes:

a read detection signal controlling unit which receives the read pulse signal and the delayed clock signal and shifts the read pulse signal by the certain clock to output first through fourth read signals; and a read detection signal outputting unit which receives the first through fourth read signals and performs a logical operation to output the read detection signal.

29. The internal clock generating circuit of claim 28, wherein the read detection signal controlling unit includes:
- a first flip-flop which synchronizes the read pulse signal with the delayed clock signal to output the first read signal;
- a second flip-flop which synchronizes the first read signal with an inverted signal of the delayed clock signal to output the second read signal;
- a third flip-flop which synchronizes the second read signal with the delayed clock signal to output the third read signal; and
- a fourth flip-flop which synchronizes the third read signal with an inverted signal of the delayed clock signal to output the fourth read signal.

30. The internal clock generating circuit of claim 28, wherein the read detection signal outputting unit includes:
- a first logic device which receives the first and second read signals and performs a logical operation;
- a second logic device which receives the third and fourth read signals and performs a logical operation; and
- a third logic device which receives a first output signal from the first logic device and a second output signal from the second logic device and performs a logical operation to generate the read detection signal.

31. The internal clock generating circuit of claim 23, wherein the read end signal generating unit includes:
- a flip-flop which receives the first signal and the delayed clock signal and shifts the first signal by a certain clock period to output a shifted signal;
- a logic unit which receives the shifted signal from the flip-flop and the read detection signal and performs a logical operation; and
- a pulse generating unit which receives an output signal from the logic unit and generates the read end signal having a certain pulse width.

32. The internal clock generating circuit of claim 31, wherein the pulse generating unit includes:
- a delaying unit which delays the output signal from the logic unit by a certain period and outputs a delayed signal; and
- a logic device which receives the output signal from the logic unit and the delayed signal from the delaying unit and performs a logical operation to generate the read end signal having a pulse width corresponding to the certain delay period of the delaying unit.

33. The internal clock generating circuit of claim 23, wherein the clock controlling unit includes a latching unit which enables output of the clock enabling signal when the read pulse signal is inputted and disables output of the clock enabling signal when the read end signal is enabled.

34. The internal clock generating circuit of claim 23, wherein the clock generating unit includes:
- a rising clock generating unit which receives the clock signal and the clock enabling signal and generates the rising clock signal; and
- a falling clock generating unit which receives the clock signal and the clock enabling signal and generates the falling clock signal.

* * * * *